(12) United States Patent
Li

(10) Patent No.: US 7,610,029 B2
(45) Date of Patent: Oct. 27, 2009

(54) METHOD FOR ACTIVE GM-C FILTER GAIN CONTROL

(75) Inventor: Qiang Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 407 days.

(21) Appl. No.: 11/394,682

(22) Filed: Mar. 31, 2006

(65) Prior Publication Data
US 2007/0232253 A1   Oct. 4, 2007

(51) Int. Cl.
*H04B 1/06* (2006.01)
*H04B 7/00* (2006.01)

(52) U.S. Cl. ............... 455/232.1; 455/251.1; 455/253.2; 455/307; 455/339

(58) Field of Classification Search ............... 455/232.1, 455/241.1, 245.2, 249.1, 251.1–253.2, 307, 455/339; 327/552–559
See application file for complete search history.

(56) References Cited

U.S. PATENT DOCUMENTS

| | | | |
|---|---|---|---|
| 6,184,747 B1* | 2/2001 | Helgeson et al. ............ 327/552 |
| 6,781,424 B2* | 8/2004 | Lee et al. ..................... 327/113 |
| 6,791,401 B2* | 9/2004 | Miwa .......................... 327/556 |
| 7,002,403 B2* | 2/2006 | Marholev ..................... 327/552 |
| 7,009,446 B2* | 3/2006 | Yoshida et al. ............... 327/552 |
| 7,454,184 B2* | 11/2008 | Ismail .......................... 455/296 |
| 2001/0020865 A1* | 9/2001 | Morie et al. ................. 327/552 |
| 2008/0045162 A1* | 2/2008 | Rofougaran et al. .......... 455/73 |
| 2008/0284505 A1* | 11/2008 | Okada .......................... 327/554 |

* cited by examiner

*Primary Examiner*—Simon D Nguyen
(74) *Attorney, Agent, or Firm*—Brake Hughes Bellermann LLP

(57) ABSTRACT

An integrated circuit chip include a transmitter configured for transmitting an electromagnetic signal, a receiver configured for receiving an electromagnetic signal, and an amplifier operatively coupled to the receiver. The amplifier includes a plurality of variable-gain Gm-C filter stages connected in series and configured for selectively amplifying frequency components within a frequency bandwidth of the received electromagnetic signal.

26 Claims, 7 Drawing Sheets

METHOD FOR ACTIVE GM-C FILTER GAIN CONTROL

TECHNICAL FIELD

This description relates to integrated circuits used to implement wireless transceiver functions, and, in particular, to active Gm-C filter gain control.

BACKGROUND

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

So that a wireless communication device can participate in wireless communications, the device includes a built-in radio transceiver (i.e., receiver and transmitter) or is coupled to an associated radio transceiver (e.g., a station for in-home and/or in-building wireless communication networks, RF modem, etc.). The receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to an RF carrier signal in accordance with a particular wireless communication standard, either directly or in one or more intermediate frequency stages, to produce the RF signals.

Conventional receivers include bandpass filters (BPFs) followed by programmable gain amplifiers (PGAs). In order to achieve adequate selectivity and gain a bandpass filter can include several filter stages.

SUMMARY

In a first general aspect, an integrated circuit chip include a transmitter configured for transmitting an electromagnetic signal, a receiver configured for receiving an electromagnetic signal, and an amplifier operatively coupled to the receiver. The amplifier includes a plurality of variable-gain Gm-C filter stages connected in series and configured for selectively amplifying frequency components within a frequency bandwidth of the received electromagnetic signal.

The integrated circuit chip can include one or more of the following features. For example, the integrated circuit chip can include a wireless transceiver. An input stage of at least one variable gain Gm-C filter stage can include a first transconductor and a second transconductor, both of the transconductors having their inputs and outputs connected in parallel. A gain of the first transconductor is more than about 8 dB greater than a gain of the second transconductor. The gain of the second transconductor can be adapted to be varied continuously, and the first transconductor can be adapted to be operatively coupled to, and operatively decoupled from, the at least one variable gain Gm-C filter stage. The integrated circuit chip can further include a variable resistor operably connected between an output of the second transconductor and ground, where the resistance of the variable resistor is variable, such that the frequency bandwidth when the first transconductor is coupled is approximately equal to the frequency bandwidth when the first transconductor is decoupled. The input stage of the at least one variable gain Gm-C filter stage can include a third transconductor having an input operatively connected to inputs of the first transconductor and to the second transconductor and having an output that is operatively unconnected from the outputs of the first and second transconductors. The third transconductor can be adapted to be switched off when the first transconductor is in a conducting state and to be switched on when the first transconductor is in a non-conducting state. An input stage of each of the variable-gain Gm-C filter stages can include a first transconductor and a second transconductor, both of the transconductors having their inputs and outputs operatively connected in parallel, where the first transconductor of each input stage is adapted to be stepwise set to achieve a range of gains values. The range of gain values can be greater than about 10 dB.

In another general aspect, an electrical circuit includes a variable voltage current source, and a first control input operably connected to the current source, where the first control input is configured to vary a voltage output available at an output of the variable voltage current source. The circuit also includes a pair of transistors operably connected to output of the current source, where gates of each transistor of the pair of transistors are connected and where the pair of transistors is configured such that a voltage signal at the gates controls a current received by the pair of transistors from the current source and output at drains of the transistors of the pair of transistors. The circuit also includes a first control transistor operably connected between the output of the variable voltage current source and the pair of transistors and a second control transistor operably connected between the pair of transistors and ground, where a gate of the second control transistor is operably connected to a gate of the first control transistor, and where the first and second control transistors are configured such that a gain control voltage signal input to the gates of the first and second control transistors switches the first and second control transistors between a high and low conductance state.

Implementations can include one or more of the following features. For example, the pair of transistors can form a complementary pair of n-channel and p-channel transistors. The first and second control transistors can form a complementary pair of n-channel and p-channel transistors. The circuit can further include an inverter operably connected to the gate of either the first or second control transistor, the inverter being adapted to produce a gain control signal input at the gate of the first control transistor that has an opposite polarity to the gain control signal input to the gate of the second control transistor. The circuit can further include an inverter operably connected to the gate of either the first or second control transistor, the inverter being adapted to ensure that both the first and second control transistors are either both in the high conductance state or both in the low conductance state.

In another general aspect, a method of processing a signal in a wireless receiver integrated circuit chip includes receiving an electromagnetic signal, and amplifying the received signal in a plurality of variable-gain Gm-C filter stages connected in series and configured for selectively amplifying frequency components of the received electromagnetic signal.

Implementations can include one or more of the following features. For example, an input stage of at least one variable gain Gm-C filter stage can include a first transconductor and a second transconductor, both of the transconductors having their inputs and outputs connected in parallel and wherein a gain of the first transconductor is greater than a gain of the second transconductor. The gain of the first transconductor can be varied discretely. The gain of the second transconductor can be varied continuously. The input stage of the at least one variable gain Gm-C filter stage can include a third transconductor having an input operatively connected to inputs of the first transconductor and to the second transconductor and having an output that is operatively unconnected from the outputs of the first and second transconductors, and the method can further include switching off the third transconductor when the first transconductor is in a conducting state and switching on the third transconductor when the first transconductor is in a non-conducting state.

The details of one or more implementations are set forth in the accompanying drawings and the description below. Other features will be apparent from the description and drawings, and from the claims.

DETAILED DESCRIPTION

Figure 1:
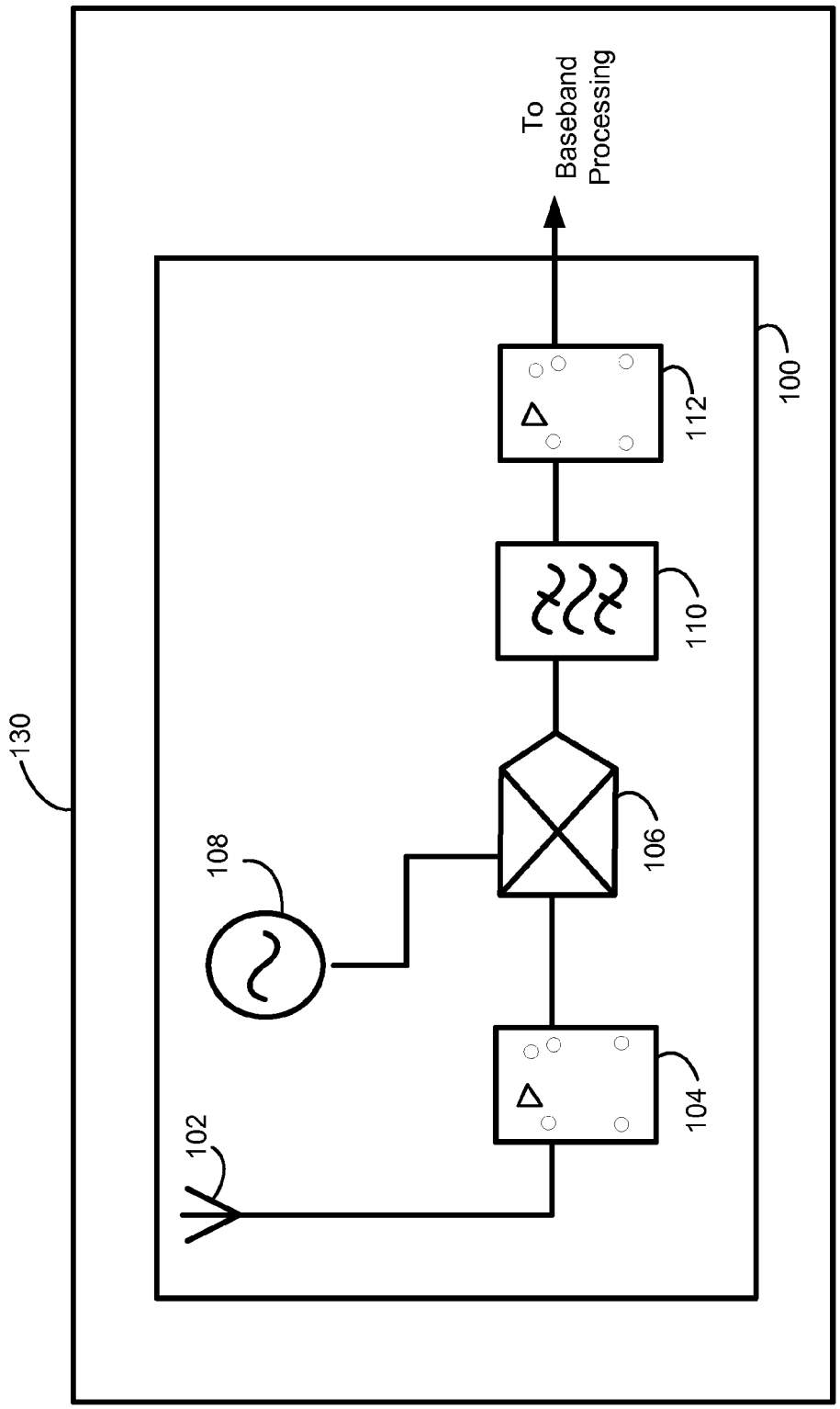
FIG. 1 is schematic block diagram of the receiver portion of a wireless communication device.

FIG. 1 is a block diagram of a receiver 100 within a wireless communication device 130. An antenna 102 is operably connected to a low noise amplifier (LNA) stage 104. The LNA stage 104 is operably connected to an input of a mixer 106, which can also operate as a down converter. The mixer 106 also has another input that receives a signal from a local oscillator 108. The output of the mixer 106 is in turn fed through a bandpass filter 110, and the output of the bandpass filter is then fed into an intermediate frequency (IF) amplifier stage 112. The output of this IF amplifier stage 112 is then passed to the baseband processing circuitry, which is not shown in FIG. 1.

The antenna 102 can be tuned to a band of frequencies over which the receiver 100 is expected to operate. A weak signal output from the antenna 102 is first amplified by the LNA 104 to raise the amplitude of the signal. The amplified signal is fed to the mixer 106 along with the signal from the local oscillator 108. The mixer 106 acts to combine the signals from the local oscillator 108 and from the amplifier 104 and delivers as its output a downconverted signal having a "difference frequency" that has been transformed to the difference between the frequency of the oscillator 106 and the incoming signal. The frequency of the oscillator can be set such that the difference frequency is much lower than the frequency of the local oscillator 108 or the frequency of the signal received by the antenna 102, and the difference frequency can be in any range. In one exemplary implementation, the difference frequency is in the range of 10-100,000 kHz, or, more particularly, in the range of 100-10,000 kHz.

The difference frequency of the downconverted signal output of the mixer 106 is passed through a bandpass filter 110 to eliminate stray frequency components that arise from nonlinear effects in the mixer as well as from signals that have frequencies close the frequency of the desired signal at the antenna that are not part of the desired downconverted signal. The output of the bandpass filter 110 is then further amplified in IF amplifier 112 to bring the signal up to a level that can be used by the baseband processing circuitry that follows the receiver 100.

Not shown in FIG. 1 are adjunct processing functions that adjust the gain of the various amplifier stages 104 and 112 in response to the changing strength of the signal output from the antenna 102. Because of the mobile nature of many wireless devices, the input signal strength may vary over a wide range, and the receiver 100 must be able to adjust its overall response to avoid overloading any of its stages or the bandpass processing circuitry that follows it.

The bandpass filter 110 can be implemented by a combination of resistive (R) and capacitive (C) components together with operational amplifier circuitry. To obtain the required frequency bandwidth with adequate selectivity, that is, the ability to amplify signals in the passband much more than signals whose frequencies are outside the passband, the bandpass filter 110 can be composed of more than one filter stage. By choosing appropriate center frequencies, frequency bandwidths for each filter stage, the desired bandpass of the composite filter 100 can be obtained.

Because many wireless devices are designed to be portable, and hence small, there is a strong desire to make all the components as small as possible. In addition, because many of these devices are battery powered, it is also desirable to make the components consume as little power as possible. For these reasons, and others, there has been a strong trend in the industry to implement, as much as possible, the electronic circuitry in the form of integrated circuits. Indeed, there is a trend to make essentially the entire electronics package for a portable wireless device fit on a single integrated circuit chip.

Because there are many functional elements to be put on such an integrated circuit chip, there is a premium on space on the chip. Therefore, it is desirable to find ways to make various elements within the integrated circuit as small as possible. In particular, the bandpass filter 110 and its associated components often take up a lot of room on an integrated circuit chip. This is because the operational amplifiers needed to implement the filter 110 are typically larger than many other types of circuit elements. In addition, the space needed for the R and C elements for the filter is relatively large. It therefore is desirable to find a way to make the amplifiers and RC components of the bandpass filter 110 smaller than in traditional integrated circuits.

One technique that meets these goals is to implement the filter as a Gm-C filter. This kind of filter uses a transconductor as the active element. A transconductor converts a voltage signal into a current signal and the output current signal is proportional to the input voltage signal. The proportionality constant relating the output current to the input voltage is called Gm, and Gm has the units of inverse resistance or conductance. Another feature of a transconductor is that the design of the transconductor allows the value of Gm to be controlled by an external voltage or current applied to a separate control input of the device. This allows for easy tuning of the gain, or other parameters of the circuit in which the transconductor is connected.

Transconductors may be applied to create a variety of circuits, as described in "Active Filter Design Using Operational Transconductance Amplifiers: A Tutorial," by R. L. Geiger and E. Sanchez-Sinencio, IEEE Circuits and Devices Magazine, Vol. 1, pp. 20-32, March 1985 and "Operational Transconductance Amplifier-Based Nonlinear Function Synthesis," by E. Sanchez-Sinencio et al, IEEE Journal of Solid-State Circuits, Vol. 24, No. 6, pp. 1576-1586, December 1989, both of which are hereby incorporated by reference. Although transconductors are known, their usage has been overshadowed by the more common operational amplifier.

Figure 2:
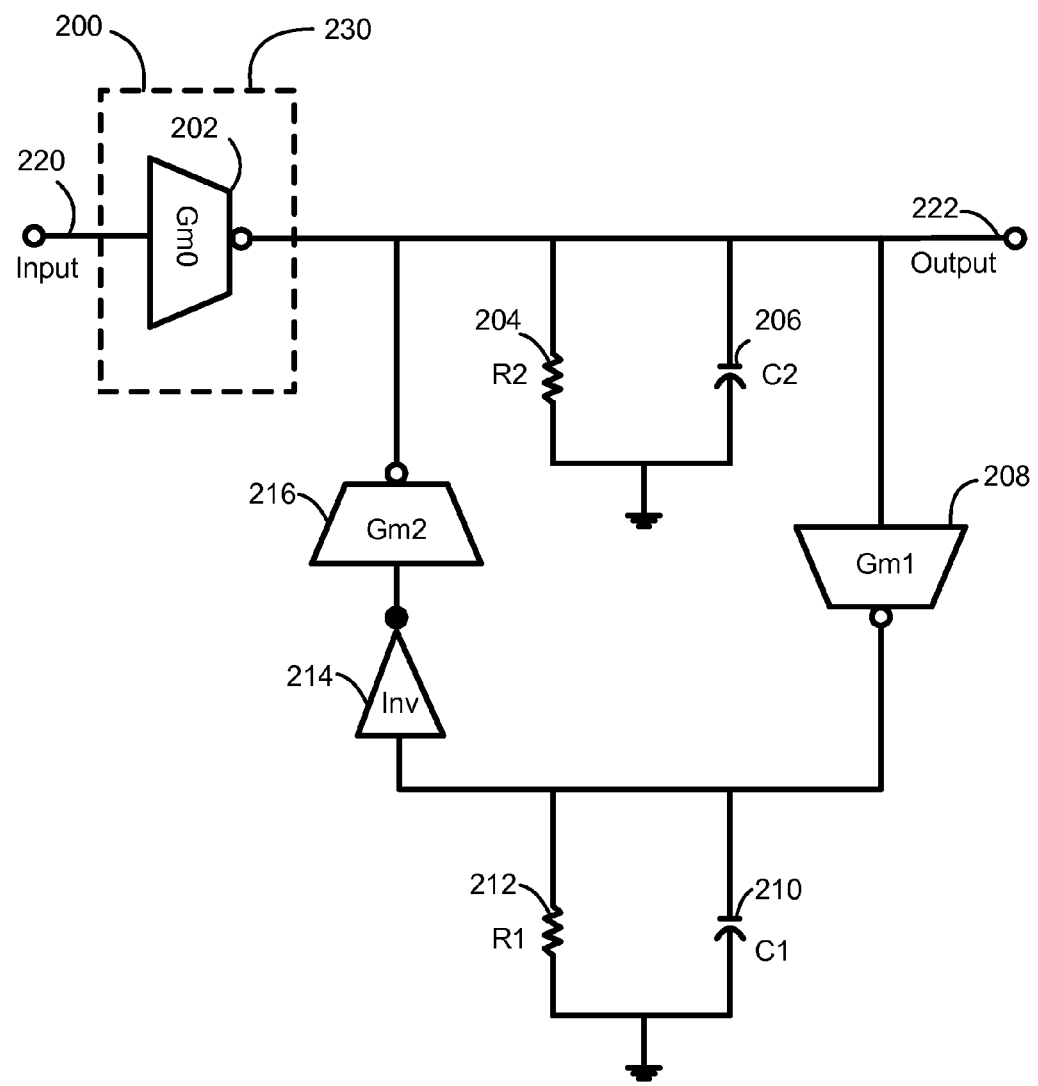
FIG. 2 is a schematic block diagram of a bi-quad filter stage that uses transconductors.

FIG. 2 is a block diagram of one stage 200 of a multi-stage filter circuit. The stage can be known as a "bi-quad" circuit 200 that uses transconductors to filter an input signal 220 and produce and output signal 222. There are three transconductor in the circuit. The input signal 220 is operably connected to the input of the first transconductor 202, which is located at an input stage 203 of the circuit. The output of transconductor 202 is operably connected to ground through a resistor 204 having a resistance, $R_2$, and a capacitor 206 having a capacitance, $C_2$. The output of transconductor 202 is also connected to the input of a second transconductor 208. The output of transconductor 208 is connected to ground through a resistor 212 having a resistance, $R_2$, and a capacitor 210 having a capacitance, $C_2$. The output of transconductor 208 is also connected to the input of an inverter stage 214 that has a gain of −1 and whose output is connected to the input of a third transconductor 216. The output of transconductor 216 is connected to the output of the first transconductor 202 and also to the ungrounded sides of the resistor 204 and the capacitor 206. The Gm values of the three transconductors are designated as $G_{m0}$, $G_{m1}$ and $G_{m2}$ for transconductors 202, 208, and 216, respectively. In terms of the Gm values of the three transconductors and the resistor and capacitor values, the transfer function, H(s), of the circuit 200 is $$H(s) = -\frac{G_{m0} R_2}{C_1^2 R_1^2 C_2 R_2} \cdot \frac{s + \frac{1}{C_1 R_1}}{s^2 + s \cdot \frac{C_1 R_1 + C_2 R_2}{C_1 R_1 C_2 R_2} + \frac{G_{m1} G_{m2} R_1 R_2 + 1}{C_1 R_1 C_2 R_2}},$$

where the transfer function parameterized by the complex frequency, s. The gain of the circuit 200 is given by:

$$\text{Gain} = \frac{G_{m0} R_2}{C_1^2 R_1^2 (G_{m1} G_{m2} R_1 R_2 + 1)}.$$

Thus, the overall gain of the filter is proportional to the $G_{m0}$ value of the input transconductor 202, while the Gm values for the transconductors 208 and 216, together with the resistor and capacitor values, determine the overall shape of the frequency bandpass of the filter circuit 200. Choosing appropriate values of the R's and C's as well as the Gm values permits designing a variety of filter types and passband shapes.

A significant advantage of the circuit 200 shown in FIG. 2 as compared with a corresponding operational amplifier implementation of a bandpass filter is that the circuit 200 requires a small amount of chip real estate compared to a conventional operational amplifier implementation. This is due to two factors: transconductor implementations are generally simpler, involve fewer transistors, and are physically smaller than corresponding operational amplifier-based filter circuits, and the R and C values required to establish a desired frequency response in the transconductor-based filter 200 are generally smaller than the corresponding values for an operational amplifier implementation. In particular, the area required to implement the capacitors having the desired capacitance values, $C_1$ and $C_2$, is smaller for the transconductor implementation shown in FIG. 2 than for a corresponding operation amplifier implementation, since smaller capacitors are needed in the transconductor implementation due to the small value of Gm (since the pole frequency of is proportional to Gm/C). Since the capacitors are essentially parallel plate capacitors formed out of the layers in the integrated circuit, a smaller capacitance can be achieved with a smaller area of semiconductor. One limitation of the circuit 200 is that while the gain of the circuit may be varied over a moderate range by varying the value of the $G_{m0}$ of the first transconductor, 202, there are cases in which larger gain changes are required.

Figure 3:
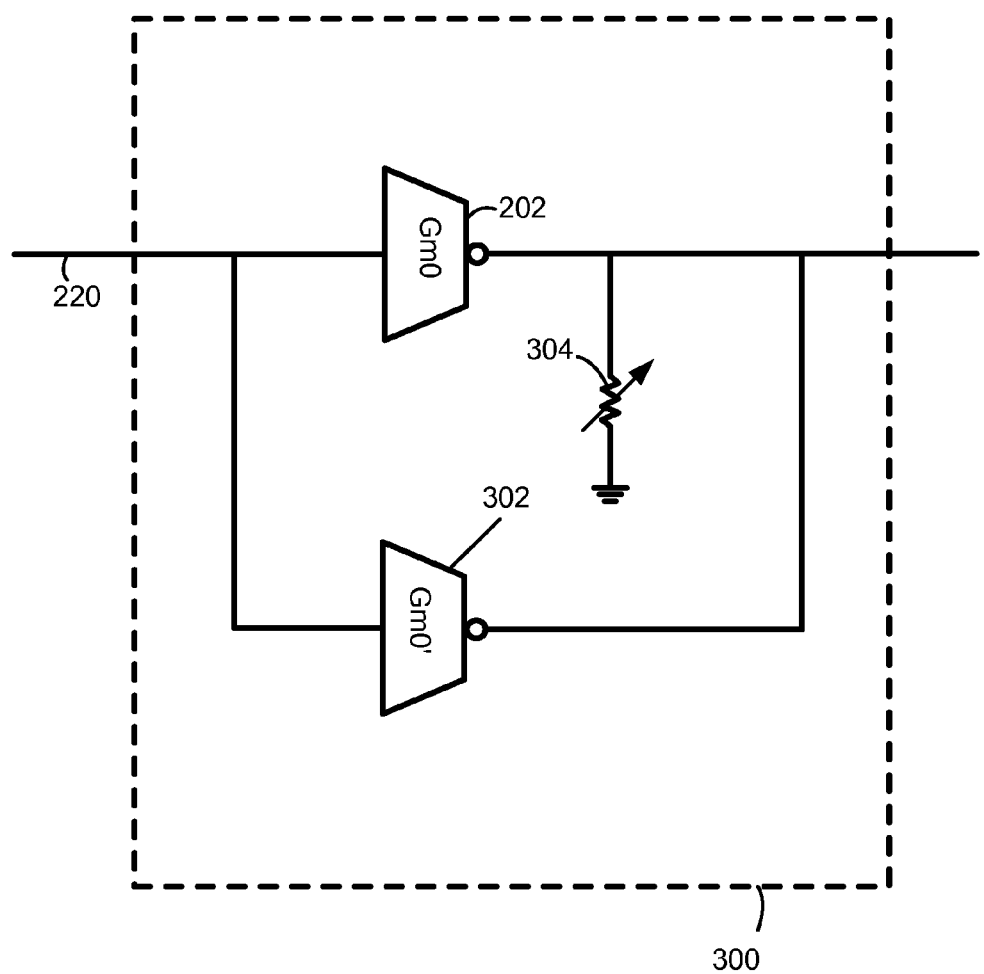
FIG. 3 is a schematic block diagram of a modified input stage of the bi-quad filter shown in FIG. 2.

FIG. 3 is a block diagram of a circuit 300 adapted to implement additional gain control in the filter circuit of FIG. 2. FIG. 3 shows only the input stage 203 of the circuit 200. At the input stage 203, a second transconductor 302 is connected in parallel with the original input transconductor 202. The overall Gm of a transconductor is determined by the geometry of the transistors that make up the transconductor, because a wider channel of the FETs making up the transconductor conducts more current and therefore results in a larger Gm value of the transconductor. Thus, by making the transistors of transconductor 202 or 302 physically larger, it is possible to increase the overall gain of the filter stage. In addition, it is possible to switch on or off the extra gain provided by the second transconductor 302 with a control signal input into the circuit 200. With such an input stage, small changes in gain can be made by continuously tuning the value of Gm0 of transconductor 202 with a control voltage, while a larger step-wise change in gain can be achieved by turning on transconductor 302.

When the second transconductor 302 is switched on there is a change in the effective output impedance of the combined input stage that includes transconductors 302 and 202. This output impedance is effectively in parallel with the resistor, R2, 204 of the biquad (shown in FIG. 2). To compensate for the change in output impedance of the input stage when transconductor 302 is turned on, a variable resistor 304 can be used. In one implementation, when transconductor 302 is switched off, the resistor 304 can be connected between the output of transconductor 202 and ground, and when transconductor 302 is switched on, the resistor 304 can be disconnected. The value of resistor 304 is chosen so that it compensates for the difference in output impedance of transconductor 302 when it is on and when it is off. In another implementation, the resistance of the resistor 304 can be varied as the transconductor 302 is switched on and its gain is turned up.

Figure 4:
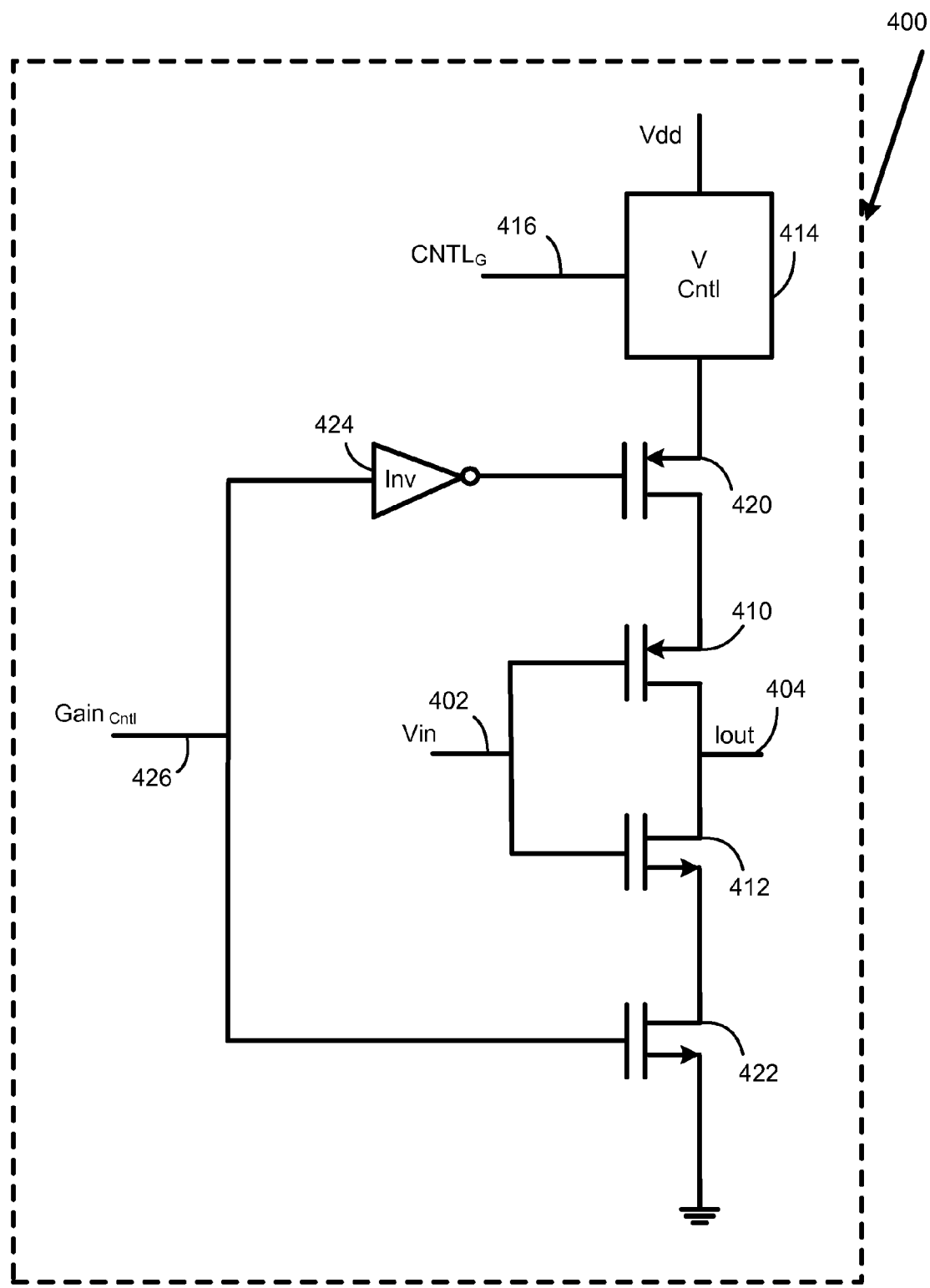
FIG. 4 is a schematic block diagram of the core of a transconductor having both continuous and stepwise switched gain control.

FIG. 4 is a block diagram of a transconductor 400 having a fine, continuous gain control and large stepwise switched gain control. The core of the transconductor 400 is formed by the transistors 410 and 412 together with a Vdd source 414 and a control input 416 to the Vdd source 414. As the input 402 to the gates of the transistors 410 and 412 is varied, the current from the Vdd source 414 is steered to the outputs of the transistors 410 and 412 in proportion to the input voltage at the gates. The $CTRL_g$ input 416 to the Vdd source 414 varies the total available supply voltage to the transconductor 400 and hence can continuously vary the Gm value of the amplifier 400 over a relatively narrow range (since Gm is proportional to Vdd). Stepwise switching of the gain of the transconductor 400 is implemented through transistors 420 and 422 and inverter 424. When a logic level control signal $Gain_{Cntl}$ 426 is activated, the conductance of transistors 420 and 422 is changed. When transistors 420 and 422 are in a high conductivity (or ON) state current flows through the transconductor transistors 410 and 412, and no current flows through the transconductor transistors 410 and 412 when transistors 420 and 422 are in a low conductivity (or OFF) state. The pair of transistors 420 and 422 ensure that both of the amplifier transistors 410 and 412 are on and off simultaneously since common mode voltage will be there all the time even when the transconductor is in an OFF state. The addition of transistors 420 and 422 allows large, stepwise, gain changes to be made to the transconductor by switching the logic level control signal $Gain_{Cntl}$ 426 between a low and high signal level.

Another issue with using a transconductor filter with an extra gain control mechanism is that if multiple filter stages are cascaded, the input capacitance of each stage is added to the output capacitance of the previous stage. For filter gain stages implemented using transconductors, the small input capacitance of a following stage has more of an effect on a previous stage than it does in an operational amplifier configuration of a filter stage. Referring again to FIG. 2, it can be seen that the input capacitance of a filter circuit stage that follows the filter circuit 200 would be added in parallel to the capacitance C2 of the filter circuit stage 200. Thus, the input capacitance of a following filter stage partly determines the frequency response of the preceding filter stage. Normally one can take this into account when defining values for C2; by assuming that C2 is made up partly of its own discrete capacitance and the input capacitance of the following stage. However, as the stepwise gain control of a transconductor is turned on or off, as described with reference to FIGS. 3 and 4, the effective input capacitance of the transconductor changes, because the input capacitance of the transistors comprising the following transconductor depends on the conduction state of the transistor, which shifts the frequency response of the preceding stage. Thus, the filter passband characteristics of the first stage will be depend on whether the extra gain of a downstream stage is on or off.

Figure 5:
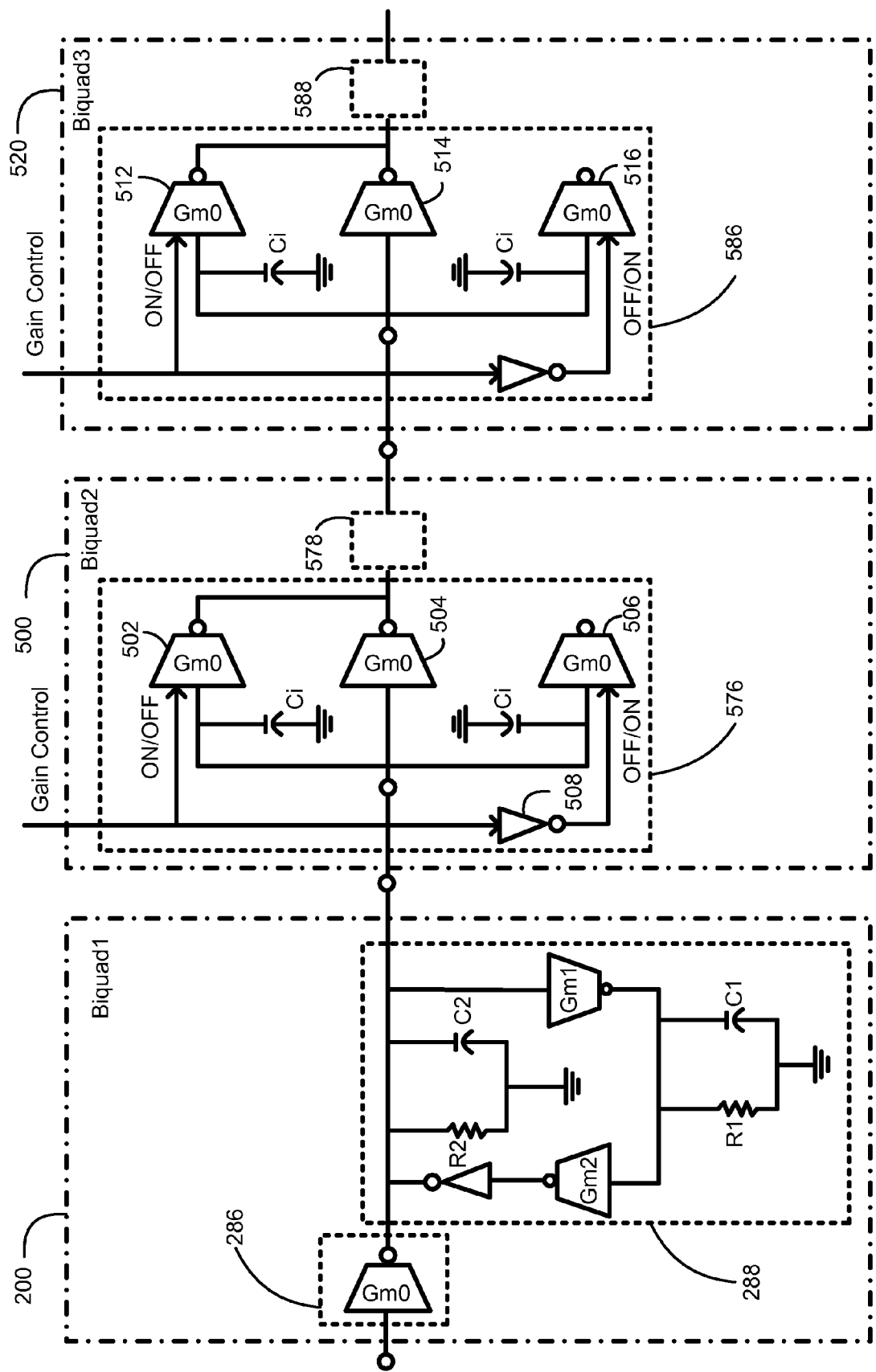
FIG. 5 is a schematic block diagram of a three stage filtering amplifier with modified gain control and input compensation stages.

FIG. 5 is a block diagram of a three-stage, cascaded transconductor-implemented filter that in which the gain of each stage can be stepwise controlled but in which the input capacitance of a stage does not vary when the gain of a downstream stage is discretely adjusted. The first stage of the filter 200 ("Biquad1") is the same as in the filter shown in FIG. 2 and has an amplification section 286 that includes a transconductor and a filter section 288 that includes resistors, capacitors, and transconductors. Stages 500 ("Biquad2") and 520 ("Biquad3") have similar filter sections 578 and 588, respectively, to the filter section 288 of Biquad1, but the amplification sections 576 and 586 of Biquad2 500 and Biquad3 520, respectively, differ from the amplification stage of Biquad 1200 in that they are configured to maintain a substantially constant input impedance, even when the gain of the stage is changed stepwise. In Biquad2 500, transconductors 502 and 504 are used to implement the amplification stage 576 of Biquad2 having a switched gain control. transconductor 506 is an extra dummy transconductor in parallel with the inputs of transconductors 502 and 504, but whose output is left unconnected. A gain control switching signal 507 is passed to transconductor 502 directly but is passed through a logic inverter 508 before being input to the dummy transconductor 506. The effect of this is that there is always an active supplemental transconductor 502 or 506 whose input is in parallel with the primary transconductor 504. Thus, when the supplemental gain is ON transconductor 502 is connected in parallel with transconductor 504, and when the supplemental gain is OFF transconductor 506 is connected in parallel with transconductor 504. Therefore, because transconductors 502 and 506 each have the same input capacitance, Ci, the total input capacitance of the stage 500 remains constant regardless of whether the supplemental gain is ON or OFF, and thus the preceding stage 200 sees the same downstream capacitive load due to filter stage 500 regardless of the status of the gain control signal in the following stage 500. Similarly, transconductors 516 and 512 serve the same function for the third stage.

To implement a three stage filter like the one in FIG. 5, each filter stage 200, 500, and 520 has slightly different passband characteristics to ensure that the overall passband of the combined stages has the characteristics that are desired. In particular, by requiring that the center frequency of each stage 200, 500, and 520 has a slightly different value the variation of the gain with frequency can be minimized in the midband of the passband, and also can enhance the steepness of the dropoff of the gain at frequencies above and below the desired passband. Table 1 lists characteristics of each stage of an exemplary three stage filter using the compensated transconductor implementation of a bi-quad for each stage of the filter. The table lists the center frequency of each stage, the Q of the stage, and the bandwidth of each stage. Additional rows in the table show the possible gain settings for each stage and the gain setting combinations that are available to allow for several steps in the gain of the three stage filter. The three stage filter shown in the Table will have a 200 kHz 3 dB bandwidth centered at 200 kHz.

TABLE 1

|  | Biquad1 | Biquad2 | Biquad3 |
| --- | --- | --- | --- |
| Ctr. freq (KHz) | 105.8 | 289.6 | 175 |
| Q | 1.93 | 1.93 | 0.85 |

TABLE 1-continued

|  | Biquad1 | Biquad2 | Biquad3 |
|---|---|---|---|
| BW (KHz) | 54.82 | 150.05 | 205.88 |
| Gain Settings | 20 dB, 0 dB | 10 dB, 0 dB | 20 dB, 10 dB, 0 dB |
| 50 dB | 20 dB | 10 dB | 20 dB |
| 40 dB | 20 dB | 10 dB | 10 dB |
| 30 dB | 20 dB | 10 dB | 0 dB |
| 20 dB | 20 dB | 0 dB | 0 dB |
| 10 dB | 0 dB | 10 dB | 0 dB |
| 0 dB | 0 dB | 0 dB | 0 dB |

Figure 6:
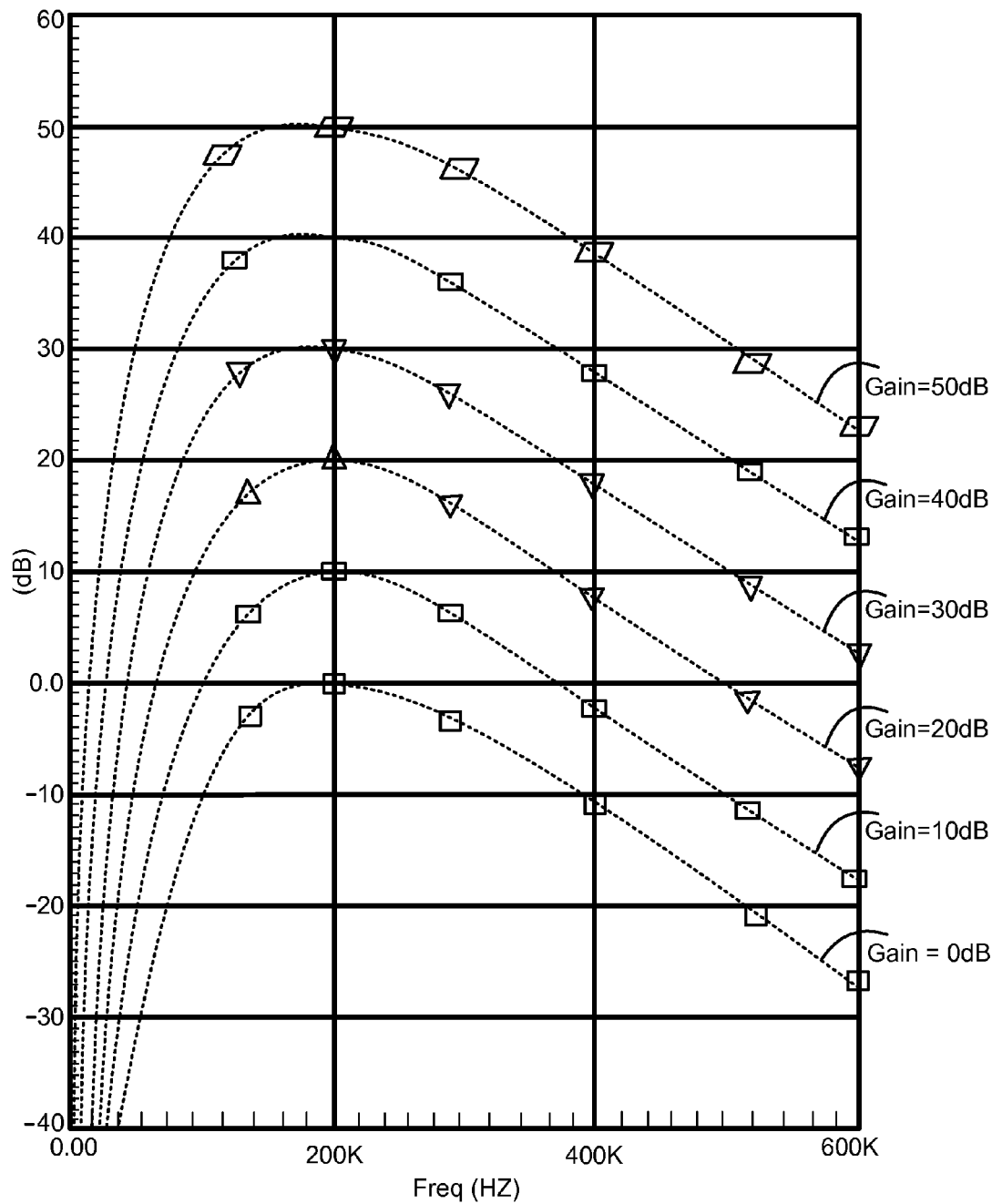
FIG. 6 is a graph showing the frequency response of a three stage filtering amplifier with gain compensation for several large step changes in the gain of the circuit.

FIG. 6 is a schematic graph of the gain of the three-stage bi-quad filter using the parameters in Table 1 as a function of input frequency for when different gain settings are used for the individual bi-quad stages. The individual gain setting for the bi-quads used to generate the curves shown in FIG. 6 are taken from the gain settings listed in Table 1. Each curve represents the overall response of the filter as a function of the input frequency for a particular gain setting. Each curve is labelled with the gain setting corresponding to one of the bottom six rows in Table 1. Notice how the passband of the filter remains essentially the same regardless of the gain setting, showing how well the compensation scheme of FIG. 5 works.

Figure 7:
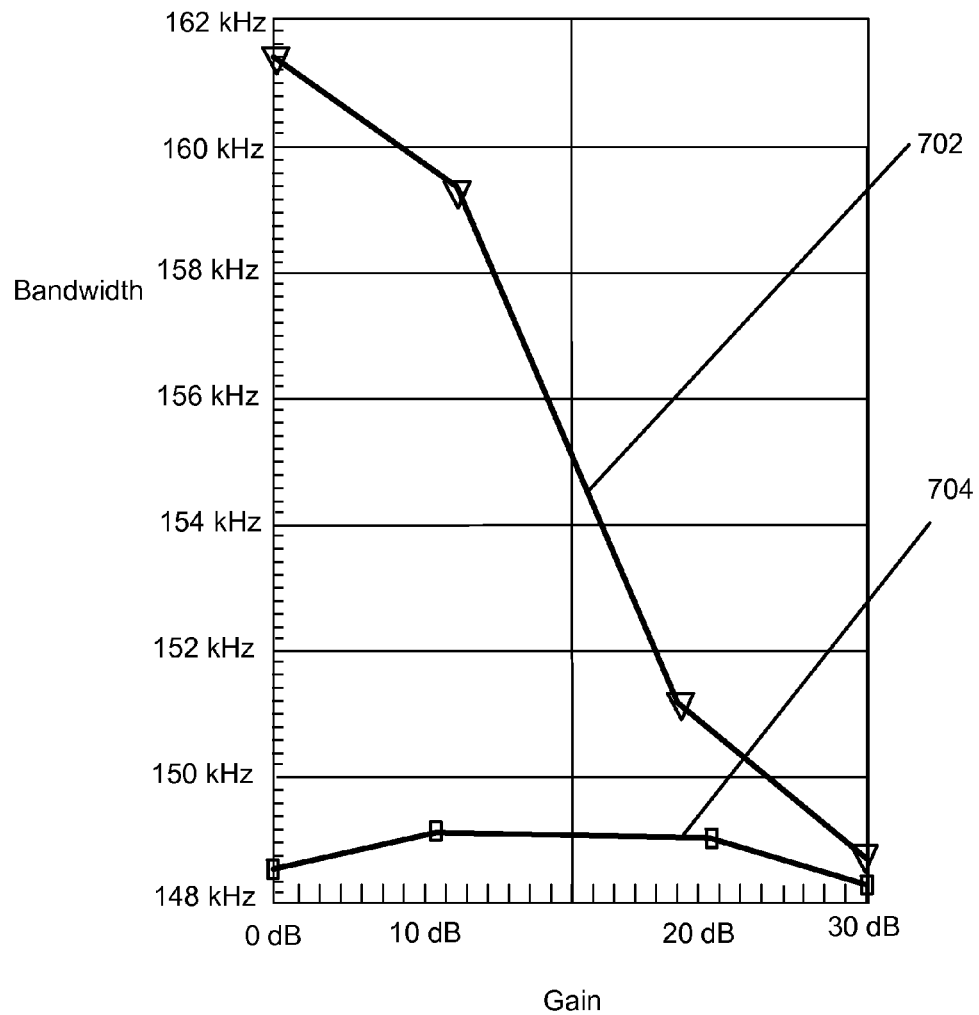
FIG. 7 is a graph showing the effect of the bandwidth of one bi-quad stage with and without gain compensation.

FIG. 7 is a schematic graph showing of the effect of varying the gain in a down stream bi-quad stages (e.g., Bi-quad3) on the bandwidth of a previous Bi-quad stage (e.g., Bi-quad2) when gain compensation is used (i.e., when a dummy transconductor is used) and when gain compensation is not used. The x-axis labels the gain setting of Bi-quad3 and the bandwidth of bi-qaud2 is shown on the y-axis. Curve 702 shows the change in the bandwidth for a filter without gain compensation. As the gain setting of Bi-quad3 is changed, the bandwidth of Bi-quad2 changes from about 161 kHz to about 149 kHz, an 8% shift in bandwidth. Curve 704 shows the same filter this time with gain compensation. The change in bandwidth is essentially zero over the range of gain, showing the beneficial effect of the compensation scheme.

The various aspects described herein which can be implemented, individually and/or collectively, by a wide range of hardware, software, firmware, or any combination thereof can be viewed as being composed of various types of "electrical circuitry." Thus, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and electrical circuitry forming a communications device containing a transmitter and/or receiver for transmitting and/or receiving information.

The aspects described herein depict different components contained within, or connected with, different other components. It is to be understood that such depicted architectures are merely exemplary, and that many other architectures can be implemented, which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or electrically interactable and/or electrically interacting components.

In one or more various aspects, related systems include but are not limited to circuitry and/or programming and/or electromechanical components for effecting the herein-referenced method aspects; the circuitry and/or programming and/or electro-mechanical components can be virtually any combination of hardware, software, firmware, and/or electromechanical components configured to effect the herein-referenced method aspects depending upon the design choices of the system designer in light of the teachings herein. Some portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter subject matter described herein are capable of being distributed as a machine-readable program product in a variety of forms, and that an illustrative embodiment of the subject matter subject matter described herein applies equally regardless of the particular type of signal bearing media used to actually carry out the distribution.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An integrated circuit chip comprising:
   a transmitter configured for transmitting an electromagnetic signal;
   a receiver configured for receiving an electromagnetic signal;
   an amplifier operatively coupled to the receiver, wherein the amplifier comprises a plurality of variable-gain Gm-C filter stages connected in series and configured for selectively amplifying frequency components within a frequency bandwidth of the received electromagnetic signal;

wherein an input stage of at least one of the variable gain Gm-C filter stages comprises a first transconductor and a second transconductor, both of the transconductors having their inputs and outputs connected in parallel;

wherein a gain of the first transconductor is more than about 8 dB greater than a gain of the second transconductor.

2. The integrated circuit chip of claim 1, wherein the integrated circuit chip comprises a wireless transceiver.

3. The integrated circuit chip of claim 1,
wherein the gain of the second transconductor is adapted to be varied continuously, and
wherein the first transconductor is adapted to be operatively coupled to, and operatively decoupled from, the at least one variable gain Gm-C filter stage.

4. The integrated circuit chip of claim 3 farther comprising a variable resistor operably connected between an output of the second transconductor and ground, the resistance of the variable resistor being variable, such that the frequency bandwidth when the first transconductor is coupled is approximately equal to the frequency bandwidth when the first transconductor is decoupled.

5. The integrated circuit chip of claim 1, wherein the input stage of the at least one variable gain Gm-C filter stage comprises a third transconductor having an input operatively connected to inputs of the first transconductor and to the second transconductor and having an output that is operatively unconnected from the outputs of the first and second transconductors.

6. The integrated circuit chip of claim 5, wherein the third transconductor is adapted to be switched off when the first transconductor is in a conducting state and to be switched on when the first transconductor is in a non-conducting state.

7. The integrated circuit chip of claim 1, wherein an input stage of each of the variable-gain Gm-C filter stages comprises a first transconductor and a second transconductor, both of the transconductors having their inputs and outputs operatively connected in parallel, where the first transconductor of each input stage is adapted to be stepwise set to achieve a range of gains values.

8. The integrated circuit chip of claim 7, wherein the range of gain values is greater than about 10 dB.

9. A method of processing a signal in a wireless receiver integrated circuit chip, the method comprising:
receiving an electromagnetic signal;
amplifying the received signal in a plurality of variable-gain Gm-C filter stages connected in series and configured for selectively amplifying frequency components of the received electromagnetic signal,
wherein an input stage of at least one variable gain Gm-C filter stage comprises a first transconductor and a second transconductor, both of the transconductors having their inputs and outputs connected in parallel and wherein a gain of the first transconductor is greater than a gain of the second transconductor.

10. The method of claim 9, further comprising varying the gain of the first transconductor discretely.

11. The method of claim 10, further comprising varying the gain of the second transconductor continuously.

12. The method of claim 9, wherein the input stage of the at least one variable gain Gm-C filter stage comprises a third transconductor having an input operatively connected to inputs of the first transconductor and to the second transconductor and having an output that is operatively unconnected from the outputs of the first and second transconductors, and further comprising switching off the third transconductor when the first transconductor is in a conducting state and switching on the third transconductor when the first transconductor is in a non-conducting state.

13. An integrated circuit chip comprising:
a transmitter configured for transmitting an electromagnetic signal;
a receiver configured for receiving an electromagnetic signal;
an amplifier operatively coupled to the receiver, wherein the amplifier comprises a plurality of variable-gain Gm-C filter stages connected in series and configured for selectively amplifying frequency components within a frequency bandwidth of the received electromagnetic signal, wherein an input stage of at least one variable gain Gm-C filter stage comprises a first transconductor and a second transconductor, both of the transconductors having their inputs and outputs connected in parallel; and
a variable resistor operably connected between an output of the second transconductor and ground,
wherein the gain of the second transconductor is adapted to be varied continuously, and
wherein the first transconductor is adapted to be operatively coupled to, and operatively decoupled from, the at least one variable gain Gm-C filter stage, and
wherein the resistance of the variable resistor is variable, such that the frequency bandwidth when the first transconductor is coupled to the at least one variable gain Gm-C filter state is approximately equal to the frequency bandwidth when the first transconductor is decoupled from the at least one variable gain Gm-C filter state.

14. The integrated circuit chip of claim 13, wherein the input stage of the at least one variable gain Gm-C filter stage comprises a third transconductor having an input operatively connected to inputs of the first transconductor and to the second transconductor and having an output that is operatively unconnected from the outputs of the first and second transconductors.

15. The integrated circuit chip of claim 14, wherein the third transconductor is adapted to be switched off when the first transconductor is in a conducting state and to be switched on when the first transconductor is in a non-conducting state.

16. The integrated circuit chip of claim 13, wherein an input stage of each of the variable-gain Gm-C filter stages comprises a first transconductor and a second transconductor, both of the transconductors having their inputs and outputs operatively connected in parallel, where the first transconductor of each input stage is adapted to be stepwise set to achieve a range of gains values.

17. The integrated circuit chip of claim 16, wherein the range of gain values is greater than about 10 dB.

18. The integrated circuit chip of claim 13, wherein the integrated circuit chip comprises a wireless transceiver.

19. The integrated circuit chip of claim 13, wherein a gain of the first transconductor is more than about 8 dB greater than a gain of the second transconductor.

20. An integrated circuit chip comprising:
a transmitter configured for transmitting an electromagnetic signal;
a receiver configured for receiving an electromagnetic signal; and
an amplifier operatively coupled to the receiver, wherein the amplifier comprises a plurality of variable-gain Gm-C filter stages connected in series and configured for selectively amplifying frequency components within a frequency bandwidth of the received electromagnetic signal, wherein an input stage of at least one variable gain Gm-C filter stage comprises a first transconductor and a second transconductor, both of the transconductors having their inputs and outputs connected in parallel, and third transconductor having an input operatively connected to inputs of the first transconductor and to the second transconductor and having an output that is operatively unconnected from the outputs of the first and second transconductors.

21. The integrated circuit chip of claim 20, wherein the third transconductor is adapted to be switched off when the first transconductor is in a conducting state and to be switched on when the first transconductor is in a non-conducting state.

22. The integrated circuit chip of claim 1, wherein an input stage of each of the variable-gain Gm-C filter stages comprises a first transconductor and a second transconductor, both of the transconductors having their inputs and outputs operatively connected in parallel, where the first transconductor of each input stage is adapted to be stepwise set to achieve a range of gains values.

23. The integrated circuit chip of claim 22, wherein the range of gain values is greater than about 10 dB.

24. The integrated circuit chip of claim 20, wherein a gain of the first transconductor is more than about 8 dB greater than a gain of the second transconductor.

25. The integrated circuit chip of claim 20,
wherein the gain of the second transconductor is adapted to be varied continuously, and
wherein the first transconductor is adapted to be operatively coupled to, and operatively decoupled from, the at least one variable gain Gm-C filter stage.

26. The integrated circuit chip of claim 20 further comprising a variable resistor operably connected between an output of the second transconductor and ground, the resistance of the variable resistor being variable, such that the frequency bandwidth when the first transconductor is coupled is approximately equal to the frequency bandwidth when the first transconductor is decoupled.

* * * * *

UNITED STATES PATENT AND TRADEMARK OFFICE
CERTIFICATE OF CORRECTION

PATENT NO. : 7,610,029 B2 Page 1 of 1
APPLICATION NO. : 11/394682
DATED : October 27, 2009
INVENTOR(S) : Qiang Li It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 617 days.

Signed and Sealed this

Twelfth Day of October, 2010

David J. Kappos
*Director of the United States Patent and Trademark Office*